(12) United States Patent
Monteen et al.

(10) Patent No.: US 8,706,289 B2
(45) Date of Patent: Apr. 22, 2014

(54) PRE-ALIGNER SEARCH

(75) Inventors: Bjorn Monteen, San Jose, CA (US);
Gustaaf Ponder, San Jose, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 13/429,289

(22) Filed: Mar. 23, 2012

(65) Prior Publication Data

US 2012/0185078 A1 Jul. 19, 2012

Related U.S. Application Data

(63) Continuation of application No. 12/152,599, filed on May 14, 2008, now Pat. No. 8,145,349.

(51) Int. Cl.
*G06F 7/00* (2006.01)

(52) U.S. Cl.
USPC ......... 700/213; 414/783; 355/73; 324/750.24

(58) Field of Classification Search
USPC ...................................................... 700/213
See application file for complete search history.

(56) References Cited

U.S. PATENT DOCUMENTS

| | | | |
|---|---|---|---|
| 4,131,267 A | 12/1978 | Ono et al. | |
| 4,448,404 A | 5/1984 | Ogawa et al. | |
| 4,466,073 A | 8/1984 | Boyan et al. | |
| 4,603,897 A * | 8/1986 | Foulke et al. | 294/185 |
| 5,065,092 A * | 11/1991 | Sigler | 324/750.24 |
| 5,191,218 A | 3/1993 | Mori et al. | |
| 5,278,494 A | 1/1994 | Obigane | |
| 5,324,012 A | 6/1994 | Aoyama et al. | |
| 5,436,693 A * | 7/1995 | Marumo | 355/73 |
| 5,550,480 A | 8/1996 | Nelson et al. | |
| 5,564,682 A | 10/1996 | Tsuji | |
| 5,852,413 A | 12/1998 | Bacchi et al. | |
| 5,944,476 A * | 8/1999 | Bacchi et al. | 414/783 |
| 6,032,997 A | 3/2000 | Elliott et al. | |
| 6,164,633 A | 12/2000 | Mulligan et al. | |
| 6,538,733 B2 | 3/2003 | Gaal et al. | |
| 6,597,432 B2 | 7/2003 | Ida | |
| 6,912,915 B2 | 7/2005 | Jian et al. | |
| 7,078,262 B2 | 7/2006 | Yamamoto et al. | |
| 7,089,782 B2 | 8/2006 | Lin et al. | |
| 7,104,579 B2 | 9/2006 | Casarotti et al. | |
| 7,214,548 B2 | 5/2007 | Fayaz et al. | |
| 2001/0043858 A1 | 11/2001 | Bacchi et al. | |
| 2003/0106574 A1 | 6/2003 | Krolak | |
| 2003/0129051 A1 | 7/2003 | Friedman et al. | |
| 2003/0133762 A1* | 7/2003 | Yamamoto et al. | 406/198 |
| 2004/0036850 A1 | 2/2004 | Tsukamoto et al. | |
| 2004/0074322 A1 | 4/2004 | Dvir | |
| 2004/0185662 A1 | 9/2004 | Fujisawa et al. | |
| 2005/0111944 A1 | 5/2005 | Aho et al. | |
| 2005/0203664 A1* | 9/2005 | Schauer et al. | 700/213 |
| 2007/0252970 A1 | 11/2007 | Shibazaki | |
| 2008/0042674 A1 | 2/2008 | Dunklee | |

* cited by examiner

*Primary Examiner* — Gene Crawford
*Assistant Examiner* — Kyle Logan
(74) *Attorney, Agent, or Firm* — Blakely, Sokoloff, Taylor & Zafman LLP

(57) ABSTRACT

Methods and systems, in one embodiment, for receiving a warped flexible wafer to be transferred between a first mechanism and a second mechanism are described. The method and system senses a first vacuum suction between the warped flexible wafer and the first mechanism. The warped flexible wafer is positioned to define a gap between the warped flexible wafer and the second mechanism. Methods and systems for closing the gap incrementally between the warped flexible wafer and the second mechanism are described. At each increment, the methods and systems detect whether a second vacuum suction is created between the warped flexible wafer and the second mechanism. When a second vacuum suction is detected between the warped flexible wafer and the second mechanism, the first vacuum suction between the warped flexible wafer and the first mechanism is released.

20 Claims, 9 Drawing Sheets

PRE-ALIGNER SEARCH

RELATED APPLICATIONS

This application is a continuation of U.S. patent application Ser. No. 12/152,599, filed on May 14, 2008, now U.S. Pat. No. 8,145,349, entitled "PRE-ALIGNER SEARCH", which is incorporated herein by reference in its entirety.

FIELD OF THE INVENTION

This invention relates to systems and methods for transferring a flexible object during one or more of a probing, inspection, assembly, or manufacturing process.

BACKGROUND OF THE INVENTION

Probing involves contacting a pad surface of an integrated circuit (IC) with a probe tip. The process involves positioning of probe pads (such as bonding pads on an IC) relative to probe tips. The positioning of bonding pads, in one system, is achieved by positioning a wafer containing the devices under test.

A semiconductor wafer typically includes many integrated circuits formed in a lattice of devices or integrated circuits. In some cases, a wafer may include a single discrete component rather than an IC, and these components may also be arranged in a lattice on the wafer. Each IC has a plurality of bonding pads that are commonly used to connect the IC to external circuitry or devices. Given the cost of packaging ICs, most ICs are tested in a wafer probing system prior to packaging.

In order for a wafer to be in the correct orientation, some wafer probing machines require a pre-aligner to manipulate the position of the wafer so that testing probe tips are correctly aligned with bonding pads on the IC when the wafer is in a test position.

As the semiconductor manufacturing art progresses, wafer manufacturing capabilities allow the production of thinner wafers. However, as a result, warped or thin flexible wafers become more difficult to handle in pre-aligning systems. Hence, it is desirable to provide a wafer handling system and method that can safely handle and transfer thin flexible wafers without causing damage.

SUMMARY OF THE DESCRIPTION

Improved methods and systems are provided for transferring an object between two positions. A pre-aligning chuck or spindle may rotate a device to a desired position for further testing or inspection.

According to one embodiment of an aspect of the invention, a warped flexible wafer is received to be transferred between a first mechanism and a second mechanism. A first vacuum suction is sensed between the warped flexible wafer and the first mechanism. The warped flexible wafer is positioned to define a gap between the warped flexible wafer and the second mechanism. The gap is incrementally closed between the warped flexible wafer and the second mechanism. At each increment, a controller determines if a second vacuum suction is detected and whether a second vacuum suction is created between the warped flexible wafer and the second mechanism.

The first vacuum suction between the warped flexible wafer and the first mechanism is released when a second vacuum suction is detected between the warped flexible wafer and the second mechanism. According to another aspect of the present invention, the first mechanism is a transfer arm and the second mechanism is a pre-aligning chuck and a compliance in the warped flexible wafer allows a transfer between the transfer arm and the pre-aligning chuck mechanism to occur without damaging the warped flexible wafer.

According to another aspect of the present invention, the first mechanism is a pre-aligning chuck and the second mechanism is a transfer arm, wherein a compliance in the warped flexible wafer allows a transfer between the transfer arm and the pre-aligning chuck mechanism to occur without damaging the warped flexible wafer.

In one example of the present invention, the closing of the gap includes incrementally moving the first mechanism, the second mechanism, or both. In a further example of a method and system according to the present invention, the moving includes incremental movements of about 5 mils.

In one example of the present invention, the warped flexible wafer is flattened on a surface of the pre-aligning chuck that is configured to rotate the flexible wafer to a pre-aligned position.

In one example of the present invention, the pre-aligned flexible wafer is transferred from the pre-aligning chuck to a test position to allow probing of the flexible wafer. In another example of the present invention, the warped flexible wafer is transferred from the transfer arm to a storage position.

In one embodiment, the compliance of the warped flexible wafer during transfer from the first mechanism to the second mechanism allows for at least 1 mm of flexing to occur with the warped flexible wafer without causing damage to the warped flexible wafer. Furthermore, in another embodiment, the warped flexible wafer has 1 to 12 mm of warping.

According to another aspect of the present invention, a machine readable storage medium having stored thereon data representing sequences of instructions, which when executed by a computer system cause the computer system to perform a method, is provided. A warped flexible wafer is received and transferred between a first mechanism and second mechanism. A sensor senses the first vacuum suction between the warped flexible wafer and the first mechanism. The warped flexible wafer is positioned in a position defining a gap between the warped flexible wafer and the second mechanism. A gap is closed incrementally between the warped flexible wafer and the second mechanism. A sensor detects, at each increment, whether a second vacuum suction is created between the warped flexible wafer and the second mechanism. The first vacuum suction is released between the warped flexible wafer and the first mechanism when a second vacuum suction is detected between the warped flexible wafer and the second mechanism.

According to another aspect of the present invention, a machine readable medium is provided where the first mechanism is a transfer arm and the second mechanism is a pre-aligning chuck. A compliance in the warped flexible wafer allows a transfer from the transfer arm to the pre-aligning chuck mechanism to occur without damaging the warped flexible wafer.

According to another aspect of the present invention, a machine readable medium is provided where the first mechanism is a pre-aligning chuck and the second mechanism is a transfer arm. A compliance in the warped flexible wafer allows a transfer from the pre-aligning chuck to the transfer arm to occur without damaging the warped flexible wafer.

In one example of the present invention, a machine readable medium is provided where closing the gap includes incrementally moving the first mechanism, the second mechanism, or both. In another example, the machine readable medium is provided to cause incremental movements of about 5 mils.

In another example, the machine readable medium is provided where the compliance of the warped flexible wafer during transfer from the first mechanism to the second mechanism allows for at least 1 mm of flexing to occur with the warped flexible wafer without causing damage to the warped flexible wafer.

According to one embodiment of an aspect of the invention, a system is providing having a base, a first mechanism supported by the base and configured to engage a warped flexible wafer with a first vacuum suction. A second mechanism is also provided being supported by the base and configured to engage the warped flexible wafer with a second vacuum suction. The second mechanism also receives the warped flexible wafer from the first mechanism. In one example, at least one sensor is provided and coupled with the first and second mechanism. In another example, the at least one sensor is configured to determine whether the warped flexible wafer is engaged with a respective mechanism after a gap is incrementally closed between the first and second mechanism.

According to one embodiment of an aspect of the invention, a control system coupled with the at least one sensor is provided. The control system is configured to receive information at each increment from the at least one sensor. The control system also determines whether to release the first vacuum suction between the warped flexible wafer and the first mechanism when a second vacuum suction is detected between the warped flexible wafer and the second mechanism.

In one example, a system is provided where the first mechanism is a transfer arm and the second mechanism is a pre-aligning chuck and a compliance in the warped flexible wafer allows a transfer between the transfer arm and the pre-aligning chuck mechanism to occur without damaging the warped flexible wafer.

In another example, a system is provided where the first mechanism is a pre-aligning chuck and the second mechanism is a transfer arm. A compliance in the warped flexible wafer allows a transfer from the transfer arm to the pre-aligning chuck mechanism to occur without damaging the warped flexible wafer. In one example, a system is provided for closing the gap incrementally by moving the first mechanism, the second mechanism, or both.

The solutions provided by at least certain embodiments of the invention thus results in a system that improves the pre-aligner transfer of thin flexible wafers. In certain embodiments, these thin flexible wafers may contain a plurality of die, each of which contains a discrete electrical component such as a power transistor with a back side contact. These and other embodiments, features, aspects, and advantages of the present invention will be apparent from the accompanying drawings and from the detailed description and appended claims which follow.

BRIEF DESCRIPTION OF THE DRAWINGS

The present invention is illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

At least certain embodiments of the invention may be used to test or inspect a component such as an integrated circuit or a wafer containing a plurality of integrated circuits or a substrate containing one or more other components. The following description is directed to wafer probing, but it will be understood that wafer probing is merely one example of an embodiment of the invention, and that all other examples of other embodiments will not be used for wafer probing but rather for other operations.

Wafer probing involves contacting the pad surface with probe tips. Probe tips move or deform during the operation of probing. This action makes the probe tips scrub or slide across the bond pads, balls/bumps or contact surfaces of the wafer being tested. This mechanical action is necessary to break through the contamination and oxide on the probe tips and/or the pads. In addition, a large amount of pressure is used to scrub away an oxide or contamination layer.

In one embodiment of the present invention, a prober system consists of two main components, or stages, one holding a wafer and the other a probe card. The two stages move relative to one another and are brought together in order to create the high pressure contact between the bond pads and the probe tips. In addition, a pre-aligner can be used when transferring an object, such as a wafer, from a storage unit to a testing chuck.

Figure 1:
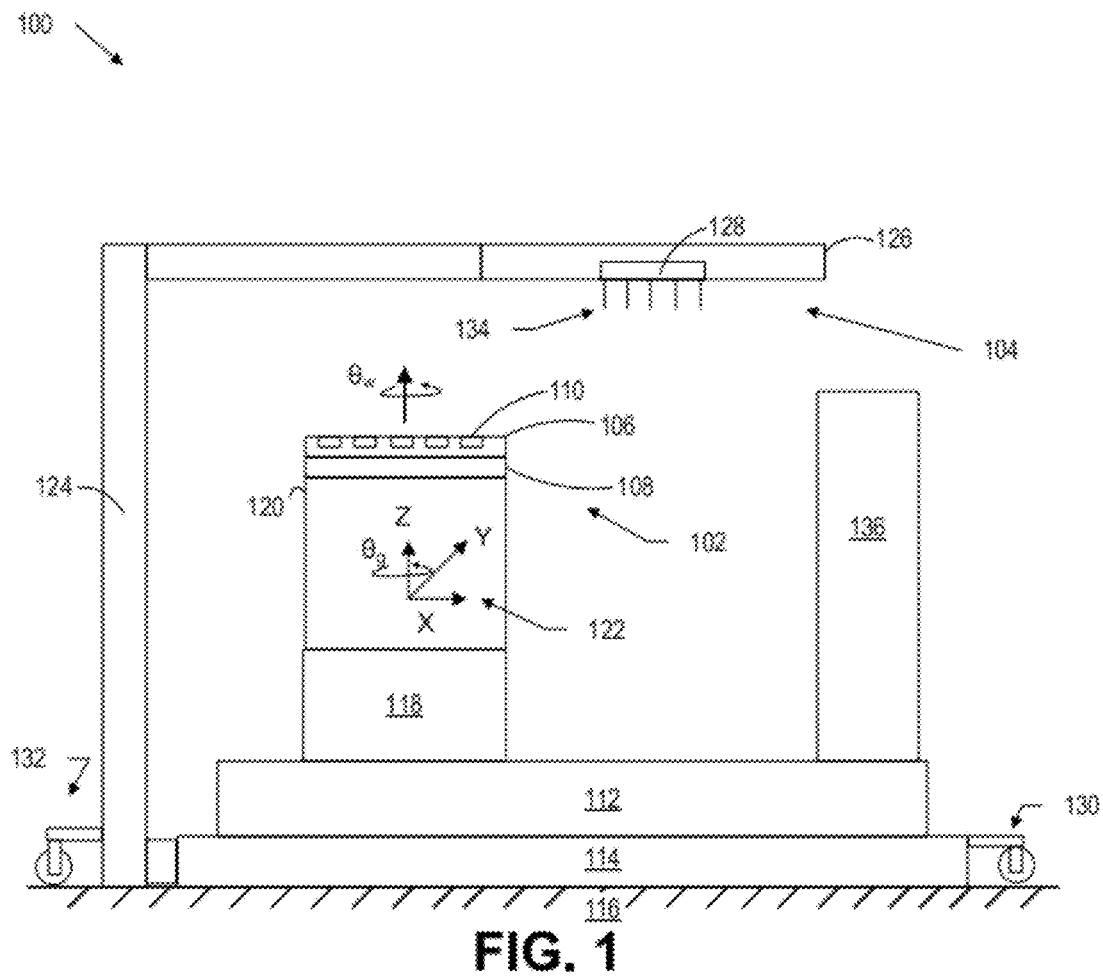
FIG. 1 shows a front view of a prober with a pre-aligner system.

FIG. 1 shows a schematic of one such possible embodiment of a system 100, comprising of two main stages. The main stages are the wafer holder assembly 102 and the probe-card holder assembly 104. In this illustrative example, the wafer holder assembly (hereinafter, "WHA") 102 is capable of motion along the X, Y, Z and $\theta_g$ directions while the probe card holder assembly (hereinafter, "PCHA") 104 is held stationary. In another embodiment, the WHA 102 can be held stationary while the PCHA 104 is capable of motion. In yet another embodiment, the WHA 102 and PCHA 104 can both be capable of motion. In another embodiment, the wafer 106 itself can be rotated around the $\theta_w$ direction relative to its holding chuck 108 in the wafer holder assembly 102. In this manner, the wafer 106 being supported by the wafer holder assembly 102 can be moved relative to the probe card pins 134 being supported by the probe-card holder assembly 104 so that the pins 134 can be brought in contact with conductive elements 110 such as pads or balls/bumps on the wafer 106.

The WHA 102 is supported by a granite base 112 and a metal frame 114 which is located on a support surface 116. The WHA 102 includes a motion system 118, a Z stage 120, and a holding chuck 108. The holding chuck 108, in one embodiment, holds the wafer 106 to present a number of bond pads 110 for testing. The holding chuck 108, being movable in the X, Y, Z and $\theta_g$ directions 122, is connected to the Z-stage 120. The X-Y motion system 118 can be an X-Y gantry system or a sawyer motor system as will be described in further detail. The X-Y motion system 118 is connected with a Z stage 120 which is capable of moving in the Z-direction to allow the probe pins 134 to make contact with the pads 110 on the wafer 106. The X-Y motion system 118 is also connected with an encoder or sensors to track the position, velocity, and acceleration of the Z-stage 120 and wafer 106.

FIG. 1 further shows a PCHA 104 which includes a support member or assembly 124, a ring carrier 126, a probe card 128, and probe tips 134. The ring carrier 126 is supported by the support assembly 124 and can be made of a metal such as aluminum or steel. The support assembly 124 is connected with the metal frame 114 which is connected with the granite base 112. In this embodiment, the PCHA 104 is stationary; however, it is possible to provide the PCHA 104 with a motion mechanism so that the probe card can move with respect to the WHA 102.

The probe card 128 is connected with the probe tips 134 and presents the probe tips 134 for contact with the wafer 106. In this illustrative example, when the Z-stage 120 is actuated, the probe tips 134 come into contact with the conductive elements 110.

The system 100 may be moved on wheels, such as wheels 130 and 132. The wheels 130 and 132 are preferably part of a set of wheels, such as four wheels, although any number of wheels can be used. The wheels can be retracted so that the metal frame 114 and granite base 112 rests on the floor either directly on the floor or by retractable legs. In FIG. 1, the wheels 130 and 132 are in a retracted position although the wheels can be moved into an extended position so that the system 100 can be rolled across the support surface 116 making the system 100 portable.

FIG. 1 further shows a pre-aligner system 136 located adjacent to the wafer holder assembly 102. The pre-aligner system 136 is shown to be supported by the granite base 112, however, it is possible to locate the pre-aligner system 136 in a separate position off of the granite base.

Figure 2A:
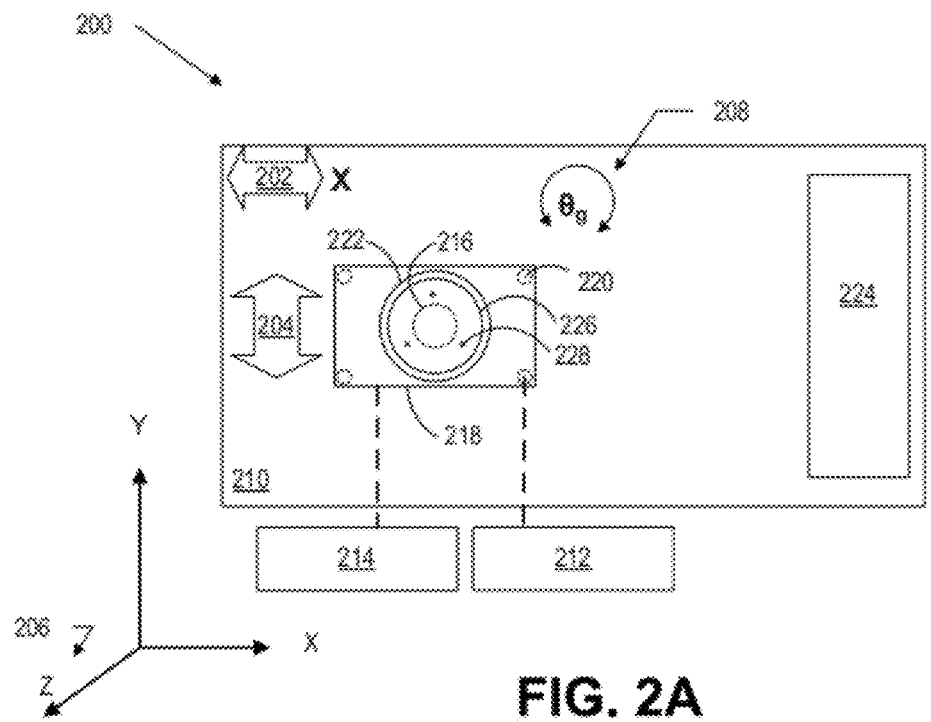
FIG. 2A shows a top view of a prober having a sawyer motor system and pre-aligner system, according to a possible embodiment.

FIG. 2A is a top view of a similar system shown in FIG. 1 having a sawyer motor system 200 arrangement. In this embodiment, the X-Y motion system 118 is a sawyer motor system 200 having a smooth platen surface 210, a platform 218 having a magnetized forcer (not shown) and driving coils which affect the magnetic flux of the forcer to move the Z stage 222 and platform 218 in an X-direction 202 or Y-direction 204 over the surface of the platen 210.

In the sawyer motor system 200, the platen 210 is a non-porous surface so that air bearings 220 mounted to the platform 218, which supports the wafer holder assembly 102, can create a pressurized region between the platform 218 and the platen surface 210. Air bearings 220, such as orifice air bearings or porous media bearings, are attached to the lower surface of the platform 218 to blow downward toward the platen thus creating a uniform air gap between the platform 218 and platen 210.

In one embodiment, four air bearings 220 are located on four corners of the platform 218. The air bearings 220 are connected to an air supply 212 which provide an flow of air or other gas or fluid to the bearings 220 to create the gap between the platform 218 and platen 210.

The platform 218 is connected with a positioning control system 214 that communicates with the forcer to cause the platform 218 to move across the platen surface in the X-direction 202, Y-direction 204, or both. Vacuum lines may also be provided from a vacuum source to create suction on the surface of the holding chuck 226 causing a wafer 106 to remain stationary relative to the holding chuck 226.

A motor 216 is connected with the Z-stage 222 to allow the Z-stage 222 to move in the Z-direction 206. In one embodiment, the holding chuck 226 may also be capable of rotating about the Z-axis 206 in a $\theta_g$ direction 208.

FIG. 2A further illustrates a pre-aligner system 224 located adjacent to the platform 218 and Z-stage 222. The platform 218 and Z-stage 222 will move according to the sawyer motor system 200 to a transfer position for accepting a wafer 106 from the pre-aligner system. The platform 218 may be moved to another position for inspection, testing, probing, or other manufacturing process. Once the process is complete, the Z-stage 222 and platform 218 will move back to a transfer position to allow the pre-aligner system 224 to receive the wafer 106 or object and to repeat the transfer process. In one embodiment, the holding chuck 226 has lift pins 228 that receive the wafer in the transfer process with the pre-aligner system 224.

Figure 2B:
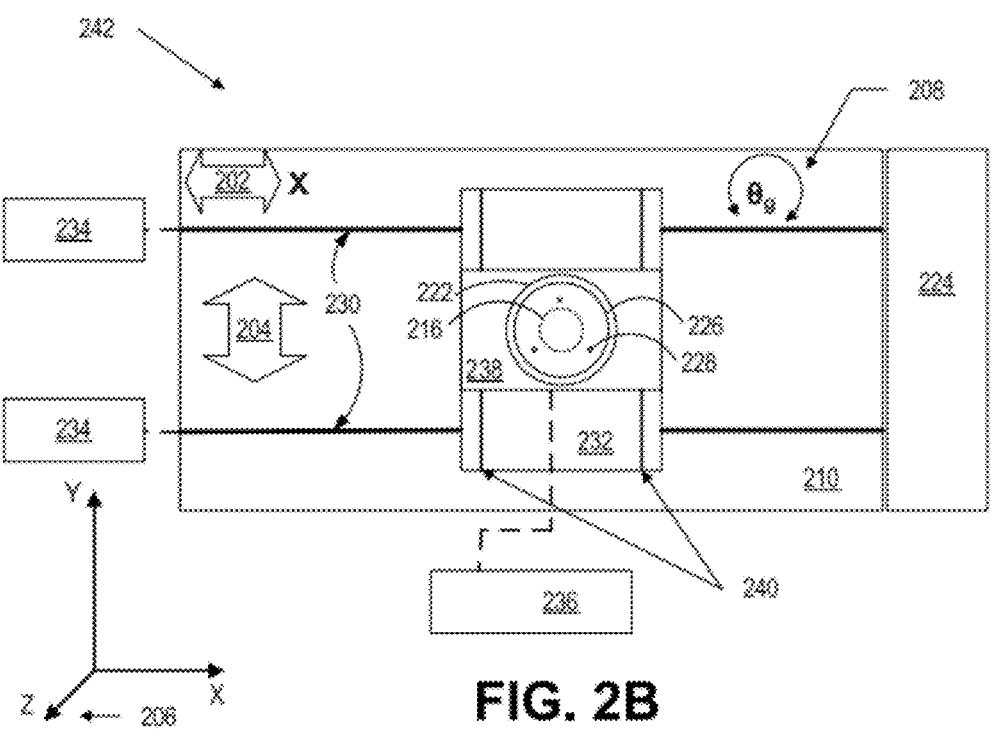
FIG. 2B shows a top view of a prober having an X-Y gantry system and a pre-aligner system, according to another possible embodiment.

FIG. 2B illustrates an X-Y motion system 118 that is an X-Y gantry system 242. The X-Y gantry system 242 has a set of two X rails 230 that allow the Z-stage 222 to move in a linear and low friction manner in the X-direction 202. The X rails 230 channel the motion of the Z-stage 222 so that a motion in the Y-direction 204 is limited or non-existent. A bridge (or X-stage) 232 rests on top of the granite base 210 and X rails 230. The bridge 232 is connected with the Z-stage 222, however, it is possible to have the Z-stage 222 be independently supported by air bearings or blow holes. The bridge 232 also is connected with the holding chuck 226 which holds a wafer or object. The holding chuck 226 is moved along the X direction 202 on the X rails 230 with respect to the granite base 210 by two X-motors 234 that are connected with the bridge 232. It is appreciated that the holding chuck 226 can be moved in the X-direction 202 by one X-motor, or any number of motors, instead of only two motors. In one embodiment, other additional motion mechanisms housed in the gantry system can move the holding chuck 226 in the Y, Z, and theta ($\theta$) directions.

Furthermore, in the X-Y gantry system, a Y-motor 236 is connected with a Y-stage 238 that is connected with two Y-rails 240 that guide the Y-stage 238 in a Y-direction 204. The Z-stage 222 is supported or connected with the Y-stage 238 so that the holding chuck 226 and wafer or object can also be moved in the Y-direction 204. The Y-motor 236 could be mounted within the X-Y motion system 118 or it could be remotely mounted and connected with the Y-stage 238 to enable the holding chuck 226 to be moved in the Y-direction 204.

In one embodiment, a brushless rotary motor 216 within the X-Y gantry system 242 is capable of raising the Z-stage 222 in a Z-direction 206 or theta ($\theta_g$) 208 direction. Depending on the specific use of the system, the rotary motor 216 can be replaced or used in combination with piezo-electric elevating mechanisms, linear motors, ball and screw arrangements, slider mechanisms that transfer a lateral force to a vertical force to drive the Z-stage 222 in the Z-direction 206, air bearings, or other arrangement for moving the Z-stage 222 in the Z-direction 206. The motor 216 is preferably mounted within the X-Y motion system 242; however, in another embodiment, the motor 216 can be remotely mounted to drive the Z-stage 222 in the Z-direction 206 or theta direction 208.

It is also appreciated, in another embodiment, that the Z-stage 222 can float above a granite base having a series of evenly distributed air orifices which blow air upwards towards the Z stage 222 in order to help it move smoothly over the granite base and thus alleviate some of the contact friction between the Z-stage 222 and the granite base. The X-Y gantry motion system 242 also includes a pre-aligner system 224 as briefly described above. The pre-aligner system 224 will be described in greater detail below.

Figure 3A:
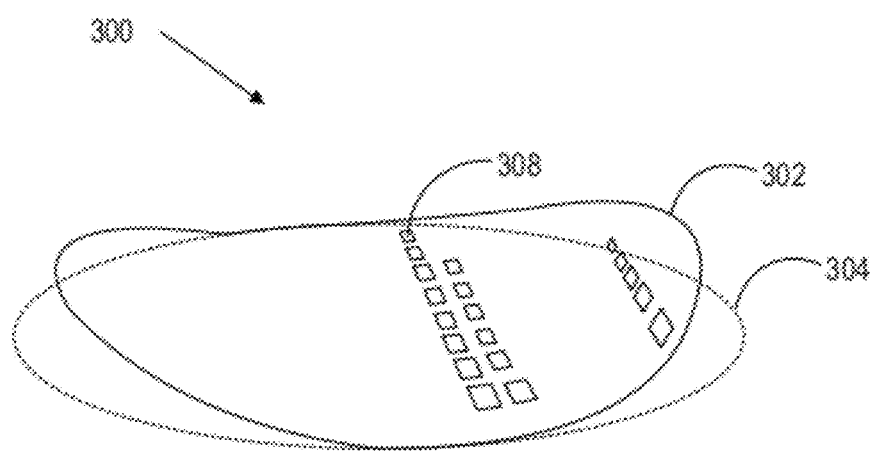
FIG. 3A shows an isometric view of a warped flexible wafer.

FIG. 3A illustrates a thin flexible wafer 300 having a thickness in the range of about 50 microns to about 12 mils. Because of the thin flexible nature of the wafer 300, warping may occur in the wafer. A warped wafer 302 can have significant compliance or flexing with respect to a flat wafer 304. Each flexible wafer 300 has an electronic component which has at least one contact pad 308.

Figure 3B:
FIG. 3B shows a front view of a warped flexible wafer.

FIG. 3B illustrates a warped wafer 302 having a flexing dimension 306. The flexing dimension 306 of the warped flexible wafer 302 can be within a range up to 12 mm without causing damage to the components of the wafer. Because of the extreme amount of warping that may be present in the warped wafer 302, wafer handling techniques need to be improved to ensure that a warped wafer 302 is properly secured to a transfer or receiving mechanism.

Figure 4A:
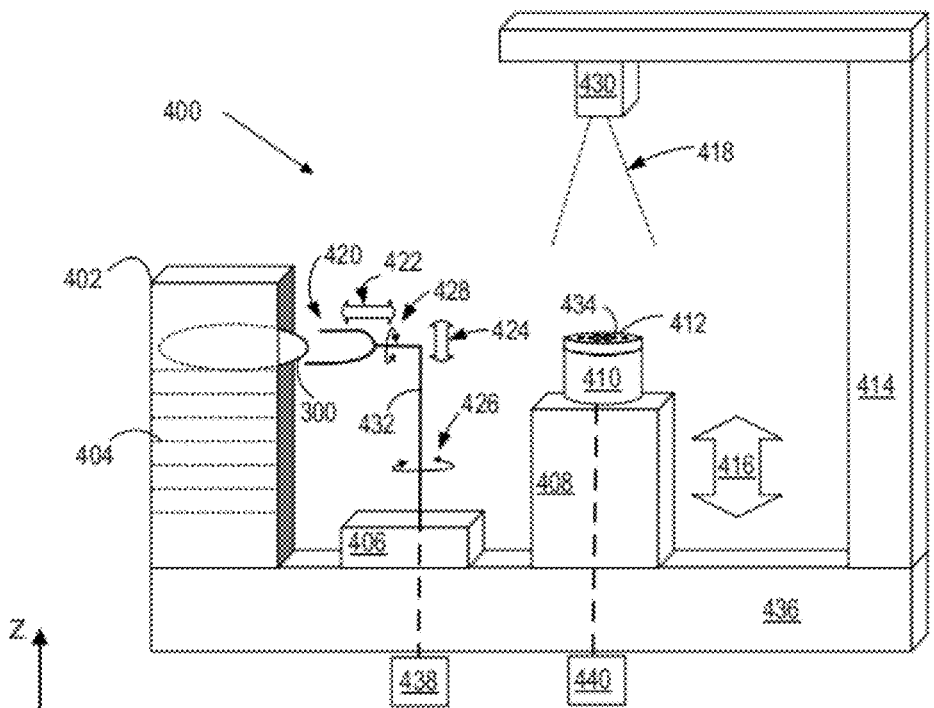
FIG. 4A shows a side view of a pre-aligner system in a load position, according to one possible embodiment.

FIG. 4A illustrates an example of a pre-aligner system 400 that can be used with the flexible wafer 300. The pre-aligner system 400 has a storage cartridge or tower 402 having slots 404 for holding a plurality of flexible wafers 300. The storage cartridge 402 is supported by a base 436.

FIG. 4A illustrates a transfer arm base 406 that is located adjacent to the storage cartridge 402 and is connected with a transfer arm mechanism 420 shown in a load position. The transfer arm 420 has a lateral arm portion having a two-pronged end portion that can extend and retract in a lateral direction 422 parallel with an X-Y plane. Of course, it is understood that various transfer arm prong configurations are possible such as three or four prong arrangements.

The transfer arm 420 is supported by a vertical segment 432 which allows the transfer arm 420 to move 424 in a Z-direction. In one embodiment, the transfer arm 420 can rotate in a roll direction 428 about the central axis of the lateral arm portion. The transfer arm 420 can also rotate about a yaw direction 426 about the central axis of the vertical segment 432 and Z-direction.

FIG. 4A further shows a spindle chuck base 408 supporting a spindle chuck mechanism 410 and being located adjacent to the transfer arm 420. The spindle chuck 410 is located within a transfer distance of the transfer arm 420 in order for the spindle chuck 410 to receive a wafer 300 from the transfer arm 420. Also, the spindle chuck 410 is located within a transfer distance in order for the transfer arm 420 to receive a wafer 300 from the spindle chuck 410, as will be discussed in further detail.

The spindle chuck 410 has a top portion 412 that is detachable from the spindle chuck 410 by being threaded or detachably fastened. The top portion 412 has a plurality of holes 434 for creating a vacuum suction between the spindle chuck 410 and the flexible wafer 300. In one embodiment, the spindle chuck 410 can also move 416 in a Z-direction.

FIG. 4A further illustrates a frame support 414 is connected with the base 436 and is connected with a sensor 430 having a sensing range 418. The sensor 430 can includes a single camera or two camera system for locating a notch on the wafer 300 to determine whether the wafer 300 is located in a desired position for testing or processing. Furthermore, the sensor 430 may be a capacitive, magnetic, inductive, reflective, laser, sonar, radar, thermal, infrared, and passive or active optical sensor. The sensor 430 can be alternatively mounted on the base 436, spindle chuck base 408, or any other location within the pre-aligner system 400 capable of sensing the wafer 300.

FIG. 4A shows a first vacuum source 438 connected with the transfer arm 420 to create a vacuum suction between the transfer arm 420 and the wafer 300. A second vacuum source 440 is connected with the spindle chuck 410 in order to create a vacuum suction between the spindle chuck 410 and the wafer 300. It is understood that a single vacuum source may be used to create a vacuum suction on the transfer arm 420 and spindle chuck 410.

In a loading operation, the transfer arm 420 extends 422 the two pronged end portion into the storage cartridge 402 to receive a wafer 300. The first vacuum source 438 is activated to cause the transfer arm 420 to grip or pneumatically hold the wafer 300 to the transfer arm 420. When a vacuum suction is detected between the wafer 300 and transfer arm 420, the wafer 300 can be safely removed from the storage cartridge 402.

Figure 4B:
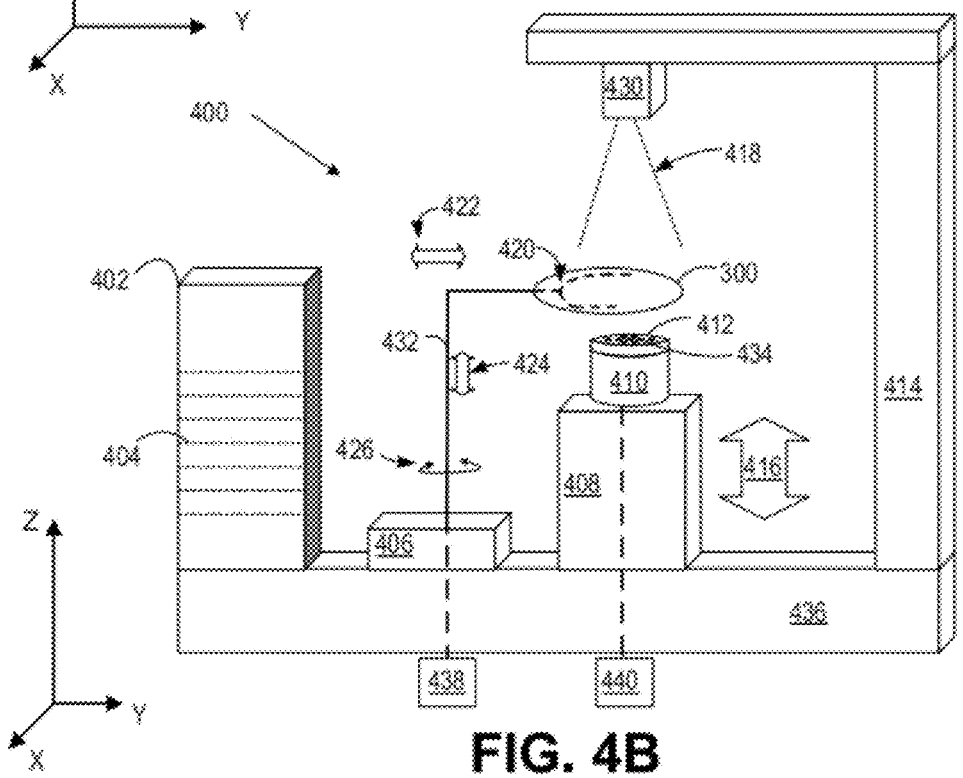
FIG. 4B shows a side view of a pre-aligner system in a transfer position, according to one possible embodiment.

FIG. 4B illustrates the pre-aligner system 400 after the transfer arm 420 has engaged with the wafer 300 and removed the wafer 300 from the storage cartridge 402. The transfer arm 420 rotates about the central axis of the vertical segment 432 and Z-direction to locate the wafer 300 above the spindle chuck 410 in a transfer position. Furthermore, the transfer arm 420 will extend and retract in the lateral direction 422 and move 424 in the Z-direction as required in order to locate the wafer 300 in the transfer position above the spindle chuck 410. The wafer transfer between the transfer arm 420 and spindle chuck 410 is described in further detail below.

Figure 5A:
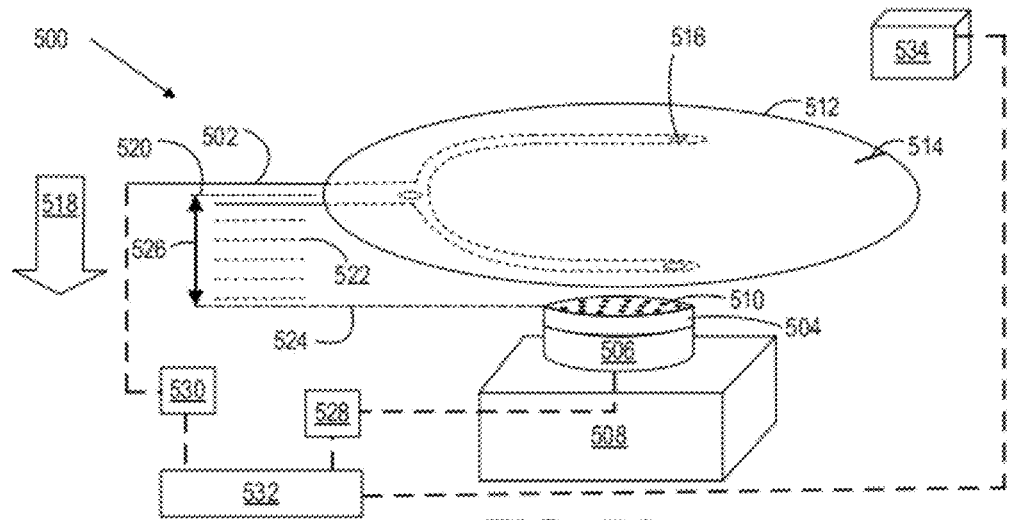
FIGS. 5A, 5B, and 5C show a side view of a transfer process of the present invention after various movements have occurred.

FIG. 5A illustrates an arm-to-spindle transfer operation 500 with a transfer arm 502 in a first position 520, according to one embodiment. The transfer operation 500 shows a transfer where a transfer arm 502 transfers a flexible wafer 512 to a spindle chuck 506. The spindle chuck 506 has a threaded spindle top portion 504 having vacuum suction through holes 510 located across a top surface of the spindle top portion 504.

FIG. 5A further shows a first vacuum sensor 530 connected with the transfer arm 502 to detect whether a vacuum suction is created between the transfer arm 502 and the wafer 512. A second vacuum sensor 528 is connected with the spindle chuck 506 in order to determine whether a vacuum suction is created between the spindle chuck 506 and the wafer 512. The first vacuum sensor 530 and second vacuum sensor 528 are connected with a control system 532. The control system 532 receives information from the vacuum sensors 530, 528 and a sensor 534, such as a CCD camera.

FIG. 5A illustrates the transfer arm 502 in a first position 520 before the flexible wafer 512 is transferred to the spindle chuck 506. The first position 520 is illustrated as a centerline position of the central axis of the transfer arm 502. In the first position 520, the wafer 512 is positioned adjacent to the spindle chuck 506 defining a gap distance 526. In one embodiment, the transfer arm 502 has three suction cups 516 positioned across a top surface of the transfer arm 502. A suction cup 516 is positioned at the end of each transfer arm prong and one suction cup 516 is positioned at the stem of the transfer arm 502 prong. It is understood that in another embodiment, another suction design is possible without the use of suction cups 516 such as a plurality of vacuum holes that are evenly spaced across the surface of the transfer arm 502 prong. In addition, a combination of suction cups and vacuum holes across the transfer arm 502 prong is possible. The suction cups 516 are connected with a vacuum source which when activated maintains the wafer 512 in a stable position with respect to the transfer arm 502.

During the transfer operation, the transfer arm 502 moves in a direction 518 toward the spindle chuck 506 in distance increments 522. In one exemplary embodiment, the transfer arm 502 moves in the direction of the spindle chuck 506 by 5 mil (0.005 inches) increments. In one embodiment, at total gap distance 526 of 100 mils is moved by the transfer arm 502 incrementally to arrive at a second position 524 where the wafer 512 is in vacuum contact with the vacuum suction holes 510 of the spindle chuck 506.

Figure 5B:
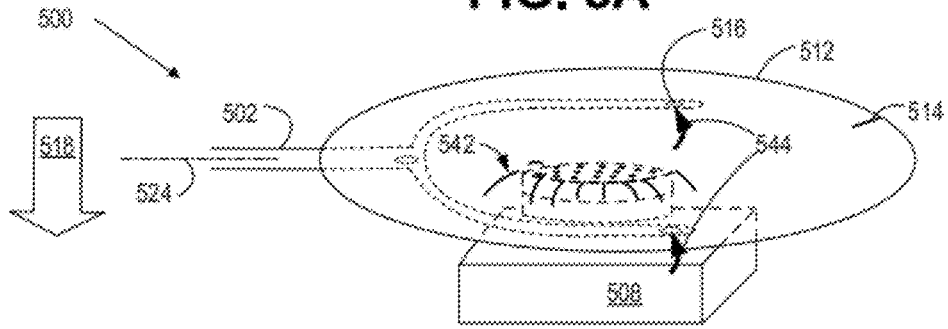

FIG. 5B shows the transfer arm 502 in the second position 524 where the wafer is in vacuum contact with the vacuum suction holes 510 of the spindle chuck 506. The wafer 512 notch or mark 514 is located in an initial first position. Once a vacuum suction is detected by the second vacuum sensor 528, the control system 532 releases the vacuum suction created between the wafer 512 and transfer arm 502. During the detection of a vacuum suction on the second vacuum sensor 528, the compliance in the flexible wafer causes the wafer to flex slightly. An exaggerated set of flexing lines 542 are shown on the surface of the flexible wafer 512 to illustrate the flexible wafer is bending slightly in an upward direction near the area of the spindle chuck 506. An important feature of the wafer transfer process 500 is that the flexible wafer 512 is able to flex to accommodate the spindle chuck 506 that is attempting to create a vacuum suction between the spindle chuck 506 and flexible wafer 512. In the process of the wafer flexing between the spindle chuck 506 and transfer arm 502, the wafer 512 is flattened out and thereby allows a vacuum suction to occur with the vacuum holes 510 and wafer 512.

In addition, in FIG. 5B, the transfer arm 502 is able to flex slightly in the direction of flex arrows 544 during the transfer so that extreme bending and damage to the flexible wafer 512 can be avoided. The flexing arrows 544 indicate that the transfer arm 502 is capable of flexing in a direction opposite to the direction of motion 518 when a vacuum suction is present between the transfer arm 502 and wafer 512. In other words, the present invention takes advantage of the wafer compliance to enable a pre-aligner search handoff process to transfer the wafer in an effective and flat manner. It is highly desirable to maintain the warped flexible wafer 512 in a flat position for detection, testing, and processing reasons.

In one embodiment, suction cups 516 are located near the end of each transfer arm 502 prong so that the flexing force on the transfer arm 502 occurs at that location. It is understood that various suction or vacuum hole placements will cause variable flexing of the transfer arm 502. In one embodiment, the compliance in the wafer 512 and flexing of the transfer arm 502 allows the wafer to flex as much as 1 mm or more without breaking or causing damage to the wafer components. It should be noted that if a stiff and non-flexible wafer were bent by 1 mm or more during transfer, the stiff wafer could be damaged.

Furthermore, the search handoff technique described has the added advantage of using the compliance in the flexible wafer 512 during handoff while also causing the wafer 512 to be further flattened on the spindle chuck 506. A flattened wafer 512 is desirable for an initiation of a pre-aligning process described in detail below.

After the transfer arm 502 releases the wafer 512, the transfer arm 502 continues to move in a direction 518 away from the wafer 512 to reach a clearance height 546 and thus leaving a gap between the wafer 512 and transfer arm 502. In one exemplary embodiment, the transfer arm 502 is in motion while the spindle chuck 506 remains stationary. However, it is understood that the transfer arm 502 may remain stationary while the spindle chuck 506 is in motion. In another embodiment, both the spindle chuck 506 and transfer arm 502 may move incrementally for transferring the flexible wafer 512.

Figure 5C:
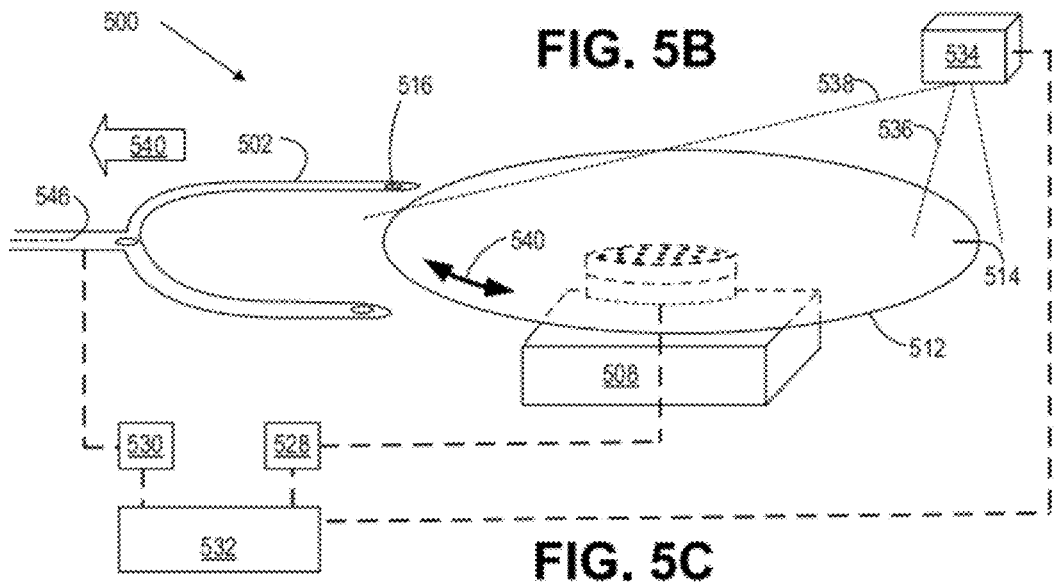

FIG. 5C shows the transfer arm 502 retracting in a direction 540 away from the spindle chuck 506 having the wafer 512 secured to it by the vacuum suction. A pre-aligning process is initiated by the spindle chuck 506 rotating in either a clockwise or counter clockwise direction about the central axis of the spindle chuck 506.

In one embodiment, the sensor 534 is a charged-coupled device (CCD) camera that is located on the frame support 414 for viewing a wafer 300 from a top-down direction. In one embodiment, the sensor 534 is positioned so that a sensing range 538 covers the entire flexible wafer 512 area to detect a notch or mark 514 in the wafer 512 for positioning by the spindle chuck 506. An advantage of a wide sensing range 538 is that the number of rotations required by the spindle chuck 506 is significantly reduced because the entire wafer 512 is visible by the sensor 534. Thus, the spindle chuck 506 can rotate less than one full rotation in order to position the notch 514 in the correct position.

In another embodiment, the sensor 534 is a CCD camera that is positioned so that the sensing range 536 covers a narrow edge portion of the flexible wafer 512 to determine when a notch or mark 514 in the wafer 512 has reached a desired position.

As shown in FIG. 5C, the spindle chuck has rotated 540 the wafer 512 so that the notch 514 is located in a desired position which guarantees that the wafer 512 is in position for transfer to a test chuck for probing, inspection, or other manufacturing process. In one embodiment, the sensor 534 is connected with the control system 532 and sends information to the control system 532 related to the rotational position of the wafer 512.

Figure 6:
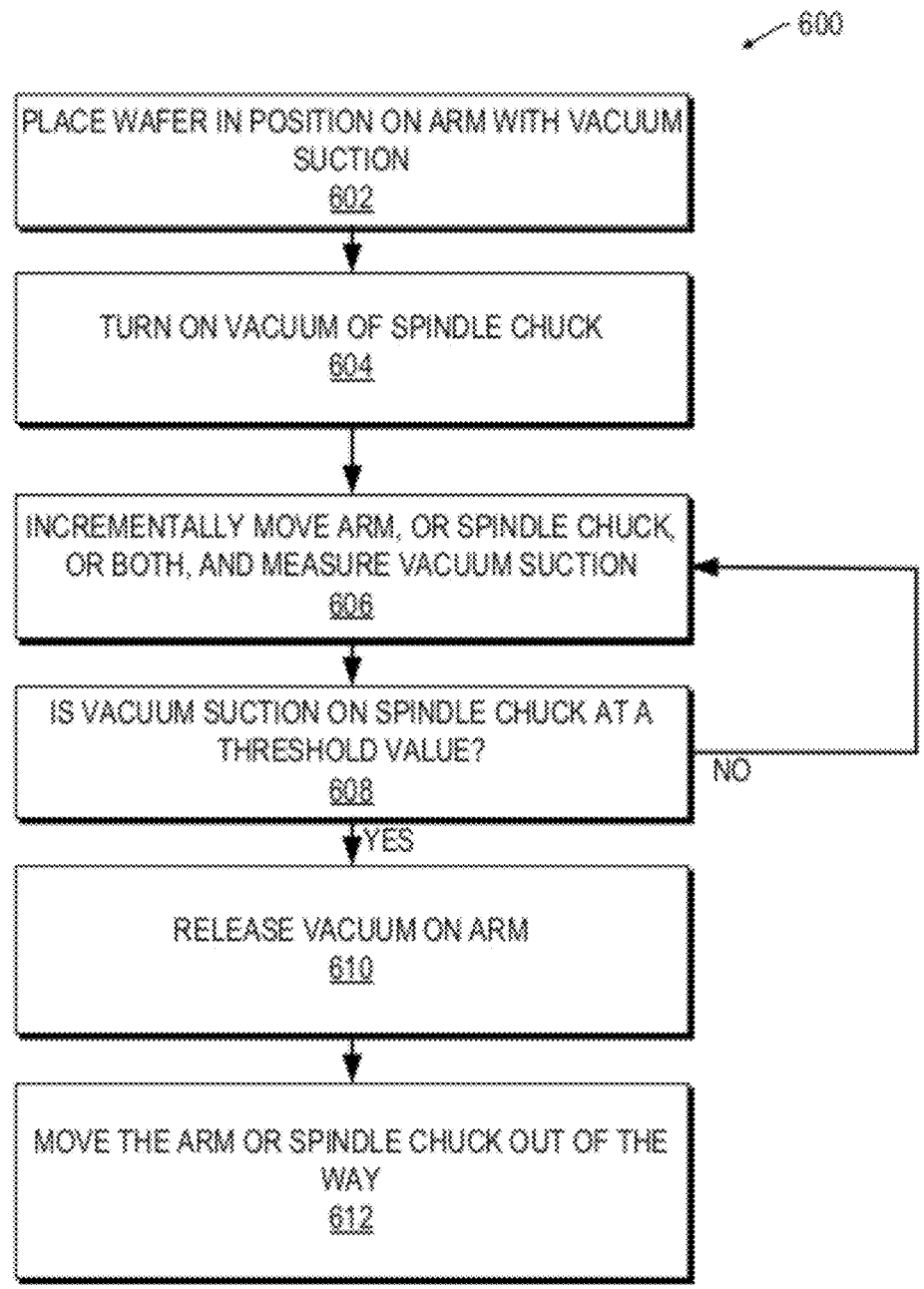
FIG. 6 is a flow chart which illustrates various operations according to one embodiment of a method of the present invention.

FIG. 6 shows a pre-aligner search handoff process 600 that is implemented by the control system 532 during a wafer 512 handoff from a transfer arm 502 to the spindle chuck 506. The wafer 512 is initially received on the transfer arm 502 where a vacuum suction is applied and sensed by sensor 530. This vacuum suction secures the wafer 512 to the transfer arm 502. The transfer arm 502 can pick up the wafer 512 from a storage cartridge 402 as previously described.

The transfer arm 502 is moved in order to place 602 the wafer 512 in the first position 520 which defines a gap between the wafer 512 and spindle chuck 506. The vacuum suction of the spindle chuck 506 is turned 604 on or activated. The transfer arm 502, or spindle chuck 506, or both are incrementally moved 606 toward each other in order to close a gap 526. At each increment, the control system 532 checks the second sensor 528 to determine 608 if a vacuum suction has been created between the flexible wafer 512 and the spindle chuck 506. If no vacuum suction is detected on the spindle chuck 506, the control system 532 continues to incrementally 606 close the gap 526 between the wafer 512 and spindle chuck 506 while measuring or detecting 608 whether a suction is created that meets a threshold vacuum suction value at each incremental move.

FIG. 6 further shows releasing 610 the vacuum suction on the transfer arm 502 when a vacuum suction that meets a threshold value is detected on the spindle chuck 506. Subsequently, the vacuum suction between the arm 502 and the wafer 512 is cleared and the transfer arm 502 or spindle chuck 506 is moved 612 to a clearance height and out of the way for the pre-aligning process to begin.

Figure 7A:
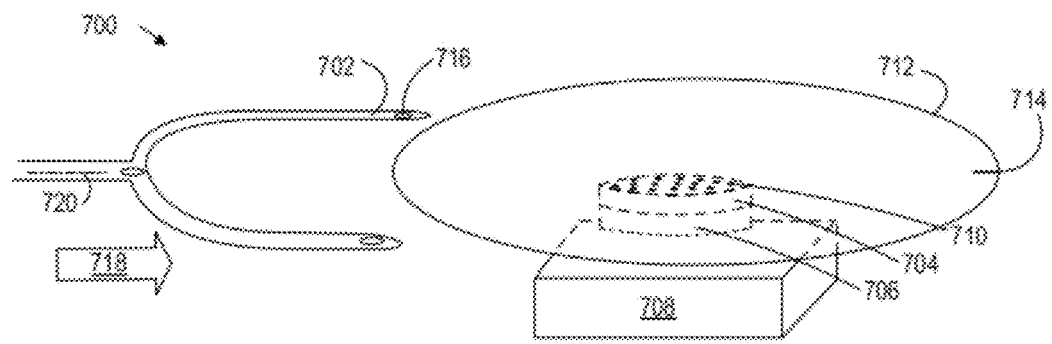
FIGS. 7A, 7B, and 7C show a side view of a transfer process of the present invention after various movements have occurred.

FIG. 7A shows a spindle-to-arm transfer operation 700 where the transfer arm 702 moves in a lateral direction 718 toward the spindle chuck 706 having a flexible wafer 712 vacuum attached thereto. The transfer arm 702 is located in a first position 720 defined by a central axis of the transfer arm 702. As previously described, spindle chuck 706 has a plurality of vacuum through holes 710 on a top portion 704 allowing a vacuum source to create suction between the spindle chuck 706 and flexible wafer 712. As previously described, wafer 712 has a locating notch 714 or other physical feature to allow pre-alignment. The spindle chuck 706 top portion 704 can also be removable as previously described.

Figure 7B:
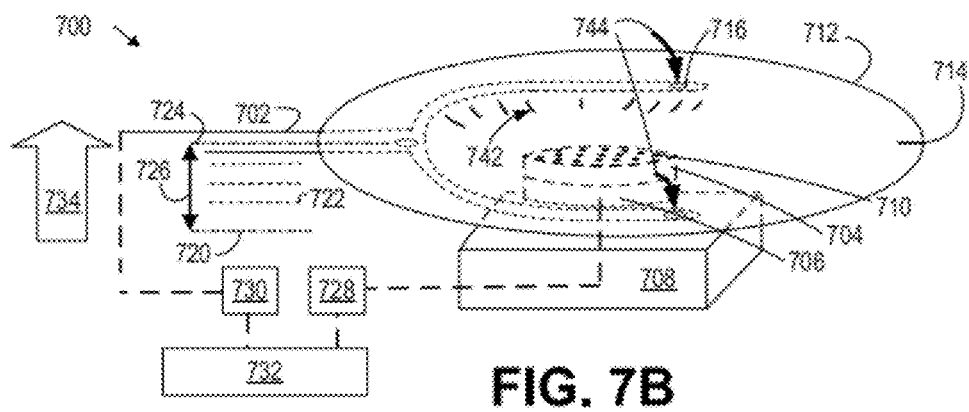

FIG. 7B shows the transfer arm 702 moving by increments 722 from a first position 720 to a second position 724 over an entire gap distance 726 in order to pick up the flexible wafer 712 from the spindle chuck 706. A spindle-to-arm transfer operation 700 may occur when the flexible wafer 712 is already tested, probed, inspected, processed, or if the wafer 712 needs to be placed back into the storage cartridge 402.

During each incremental move 722, the control system 732 checks the first vacuum sensor 730 to determine whether a vacuum is created between the transfer arm 702 and flexible wafer 712. Because of the flexible nature of the wafer 712, the wafer 712 is able to slightly flex upward in the area of the transfer arm 702 prong to provide the compliance needed to enable a vacuum suction to be present between the transfer arm 702 and flexible wafer 712. The flexing of the wafer 712 is shown by exaggerated flexing lines 742. The compliance required during transferring may be dependent on how much the wafer 712 is warped. The transfer arm 702 is also capable of flexing to prevent wafer breakage as illustrated by the flexing arrows 744. In one embodiment, the flexing arrows 744 indicate that the transfer arm 702 is slightly flexing in a direction opposite to the direction of motion 734. The flexing may occur because the wafer 712 is still engaged with the spindle chuck 706 therefore causing the wafer to exert a downward force on the transfer arm prong.

Figure 7C:
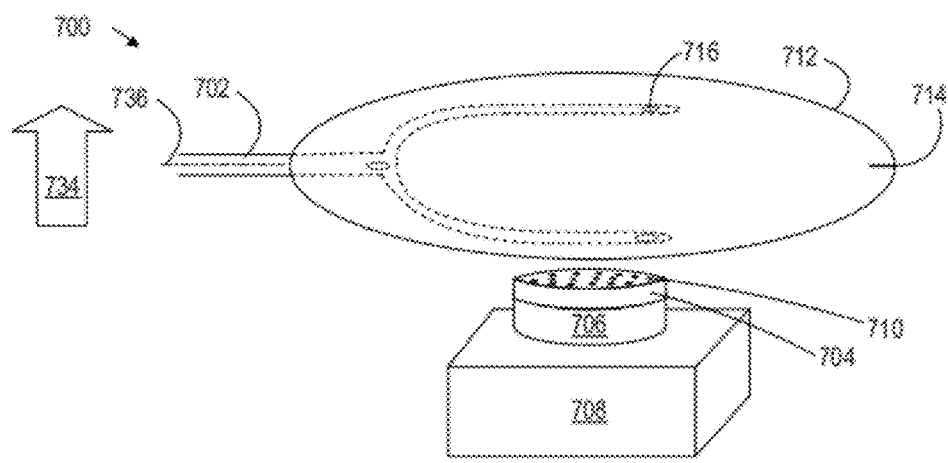

As shown in FIG. 7C, once a vacuum suction is detected on the first vacuum sensor 730 (connected with the transfer arm 702), the vacuum suction for the spindle chuck 706 is released which may be confirmed by the second vacuum sensor 728. The transfer arm 702 continues to move in a first direction 734 allowing the wafer 712 to be moved away from the spindle chuck 706 to a clearance position 736.

Figure 8:
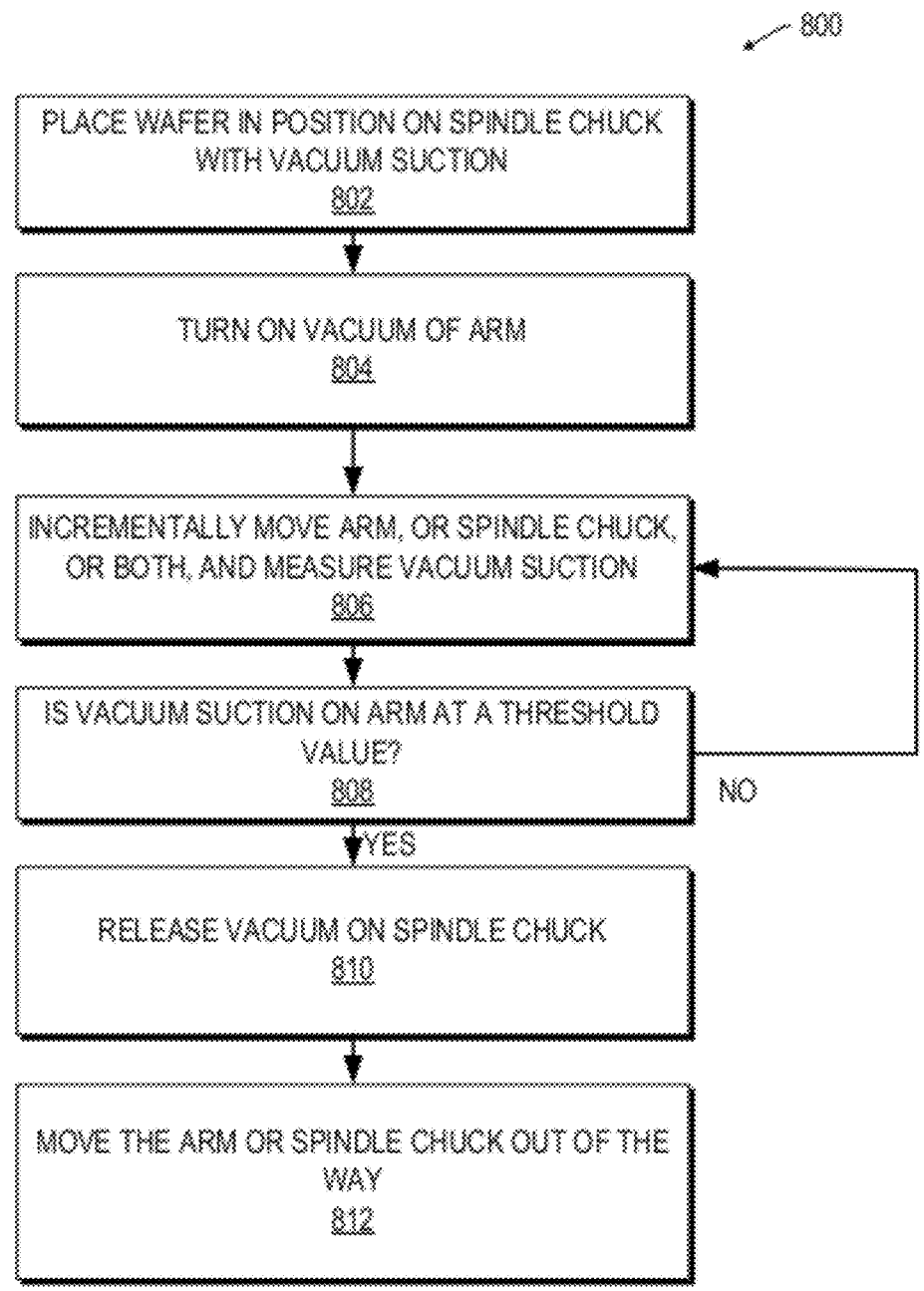
FIG. 8 is a flow chart which illustrates various operations according to another embodiment of a method of the present invention.

FIG. 8 shows a pre-aligner search handoff process 800 that is implemented by the control system 732 during a spindle-to-arm wafer handoff process 700 where the wafer 712 is transferred from a spindle chuck 706 to the transfer arm 702. The wafer 712 is initially received on the spindle chuck 706 where a vacuum suction is applied and sensed by a second sensor 728. The spindle chuck 706 can receive the wafer 712 from a testing chuck or processing location as previously mentioned.

The transfer arm 702 is placed in the first position 720 which defines a gap between the wafer 712 and transfer arm 702. The vacuum suction of the transfer arm 702 is turned 804 on or activated. The transfer arm 702, or spindle chuck 706, or both are incrementally moved 806 in a direction to close a gap 726 between the wafer 712 and transfer arm 702. At each incremental movement 722, the control system 732 checks the first sensor 730 to determine 808 if a vacuum suction has been created between the flexible wafer 712 and the transfer arm 702. If no vacuum suction is detected on the transfer arm 702, the control system 732 continues to incrementally 806 close the gap 726 between the wafer 712 and transfer arm 702 while measuring or detecting whether a suction is created at each incremental move 722.

FIG. 8 further shows releasing 810 the vacuum suction on the spindle chuck 706 when a vacuum suction, that meets a threshold value, is detected on the transfer arm 702. Subsequently, the transfer arm 702 moves the wafer 712 to a storage cartridge 402 for storing.

Figure 9:
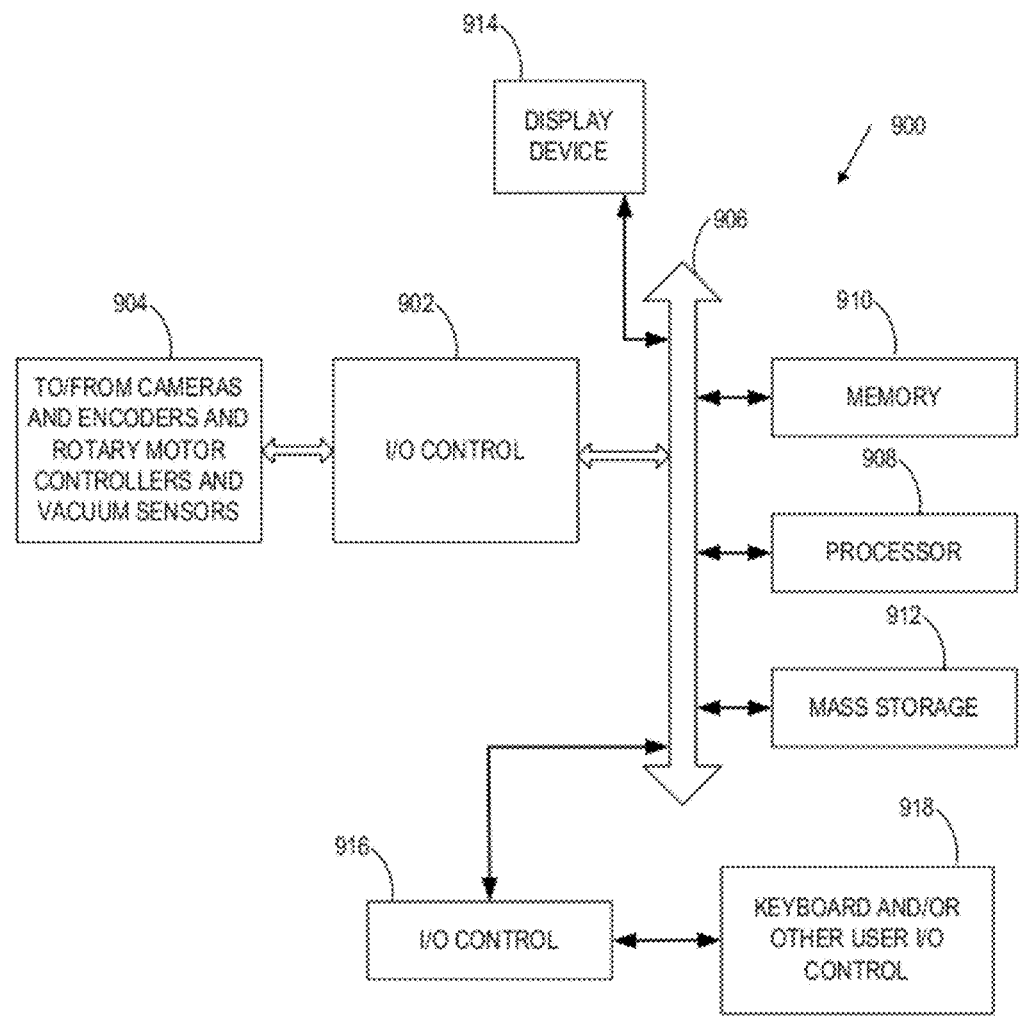
FIG. 9 shows an example of a computer system which may be used to control a transfer system of the present invention.

FIG. 9 illustrates a control system 900 according to one embodiment. The control system 900 may be a general purpose or special purpose data processing system which is programmed (e.g. with a software program) or otherwise configured to perform one or more of the methods described herein. The pre-aligner search control system 900 may include a processor(s) and a bus coupled to the processor(s) and a memory (e.g. RAM or flash memory, etc.) coupled to the bus and to the processor(s). The software program, if used, includes executable program instruction which when executed causes a data processing system to perform one or more of the methods described herein. The software program instructions may be stored in a machine readable storage medium such as a RAM, flash memory, or other storage media.

FIG. 9 further shows a digital processing system which may be a conventional general purpose computer system. This system 900 may be used to control the wafer pre-aligner system 400 by receiving inputs from the vacuum sensors and cameras and information from encoders that enable the effective transfer of a flexible wafer between a transfer arm and spindle chuck.

These inputs and outputs 904 as shown in FIG. 9 are channeled through an input/output controller 902 which provides data to and from the remainder of the processing system 900. Typically, the processor 908 is a general purpose microprocessor which retrieves executable computer program instructions from a mass storage device 912, such as a hard disk, and which stores values in the memory 910, which may be random access memory. Data is exchanged through this system over at least one bus 906 which interconnects the various components of the system 900. Also shown in FIG. 9, the system may include a display device 914, such as a conventional CRT or LCD monitor, and may further include user I/O control input 918 such as a keyboard which operates under control of a controller 916.

The processor 908 typically performs the computations described above in order to determine whether a wafer has been successfully transferred. Furthermore, the processor enables the vacuum suction and motor controls to operate in accordance with the methods of the present invention, such as the method shown in FIGS. 6 and 8. In this manner, a pre-aligner search system may be provided relatively inexpensively and yet providing safe and effect wafer transfers without causing damage to flexible wafers.

Another key advantage of the present system is that the compliance in the flexible wafers allows the wafer to flex and thus enables the control system to implement the search handoff process. Transferring the wafer with a vacuum search process enables a vacuum suction to effectively occur between a wafer and a holding surface. In the case of very warped wafers, the tension created on the warped wafer between the transfer arm and spindle chuck enables the wafer to flatten out. After being flattened, the vacuum suction between the wafer and spindle chuck or transfer arm can be more easily created and detected.

Thus, apparatuses and methods have been provided for achieving effective wafer transfers in a pre-aligning system. Although the present invention has been described with reference to specific exemplary embodiments, it will be evident that various modifications and changes may be made to these embodiments without departing from the broader spirit and scope of the invention as set forth in the claims. Accordingly the specification and drawings are to be regarded in an illustrative rather than a restrictive manner.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method comprising:
receiving a wafer to be transferred between a first mechanism and a second mechanism;
sensing a first vacuum suction between the wafer and the first mechanism;
positioning the wafer in a position defining a gap between the wafer and the second mechanism;
closing the gap over a set of two or more increments between the wafer and the second mechanism, wherein each of the increments is less than the gap;
detecting, at each increment in the set of increments, whether a second vacuum suction is created between the wafer and the second mechanism; and
releasing the first vacuum suction between the wafer and the first mechanism when a second vacuum suction is detected between the wafer and the second mechanism.

2. The method of claim 1, wherein the compliance of the wafer during transfer from the first mechanism to the second mechanism allows for at least 1 mm of flexing to occur with the wafer without causing damage to the wafer.

3. The method of claim 1, wherein the wafer has 1 to 12 mm of warping.

4. The method of claim 1, wherein the first mechanism is a pre-aligning chuck and the second mechanism is a transfer arm, and wherein a compliance in the wafer allows a transfer between the transfer arm and the pre-aligning chuck mechanism to occur without damaging the wafer.

5. The method of claim 4, further comprising transferring the wafer from the transfer arm to a storage position.

6. The method of claim 1, wherein closing the gap includes incrementally moving the first mechanism, the second mechanism, or both.

7. The method of claim 6, wherein the moving includes incremental movements of about 5 mils.

8. The method of claim 1, wherein the first mechanism is a transfer arm and the second mechanism is a pre-aligning chuck, and wherein a compliance in the wafer allows a transfer between the transfer arm and the pre-aligning chuck mechanism to occur without damaging the wafer.

9. The method of claim 8, further comprising flattening the wafer on a surface of the pre-aligning chuck that is configured to rotate the wafer to a pre-aligned position.

10. The method of claim 9, further comprising transferring the pre-aligned wafer from the pre-aligning chuck to a test position to allow probing of the wafer.

11. A machine readable medium having stored thereon data representing sequences of instructions, which when executed by a computer system cause the computer system to perform a method comprising:
receiving a wafer to be transferred between a first mechanism and a second mechanism;
sensing a first vacuum suction between the wafer and the first mechanism;
positioning the wafer in a position defining a gap between the wafer and the second mechanism;
closing the gap over a set of two or more increments between the wafer and the second mechanism, wherein each of the increments is less than the gap;
detecting, at each increment in the set of increments, whether a second vacuum suction is created between the wafer and the second mechanism; and
releasing the first vacuum suction between the wafer and the first mechanism when a second vacuum suction is detected between the wafer and the second mechanism.

12. The machine readable medium of claim 11, wherein the first mechanism is a transfer arm and the second mechanism is a pre-aligning chuck, and wherein a compliance in the wafer allows a transfer between the transfer arm and the pre-aligning chuck mechanism to occur without damaging the wafer.

13. The machine readable medium of claim 11, wherein the first mechanism is a pre-aligning chuck and the second mechanism is a transfer arm, and wherein a compliance in the wafer allows a transfer between the transfer arm and the pre-aligning chuck mechanism to occur without damaging the wafer.

14. The machine readable medium of claim 11, wherein the compliance of the wafer during transfer from the first mechanism to the second mechanism allows for at least 1 mm of flexing to occur with the wafer without causing damage to the wafer.

15. The machine readable medium of claim 11, wherein closing the gap includes incrementally moving the first mechanism, the second mechanism, or both.

16. The machine readable medium of claim 15, wherein the moving includes incremental movements of about 5 mils.

17. A system comprising:
a base;
a first mechanism supported by the base and configured to engage a wafer with a first vacuum suction;
a second mechanism supported by the base and configured to engage the wafer with a second vacuum suction and to receive the wafer from the first mechanism;
at least one sensor coupled with the first and second mechanism, the at least one sensor being configured to determine whether the wafer is engaged with a respective mechanism after a gap is closed over a set of two or more increments between the first and second mechanism, wherein each of the increments is less than the gap; and
a control system coupled with the at least one sensor, the control system being configured to receive information at each increment in the set of increments, from the at least one sensor and to determine whether to release the first vacuum suction between the wafer and the first mechanism when a second vacuum suction is detected between the wafer and the second mechanism.

18. The system of claim 17, wherein the first mechanism is a transfer arm and the second mechanism is a pre-aligning chuck, and wherein a compliance in the wafer allows a transfer between the transfer arm and the pre-aligning chuck mechanism to occur without damaging the wafer.

19. The system of claim 17, wherein the first mechanism is a pre-aligning chuck and the second mechanism is a transfer arm, and wherein a compliance in the wafer allows a transfer between the transfer arm and the pre-aligning chuck mechanism to occur without damaging the wafer.

20. The system of claim 17, wherein closing the gap includes incrementally moving the first mechanism, the second mechanism, or both.

* * * * *